(12) United States Patent
Saji et al.

(10) Patent No.: US 11,652,016 B2
(45) Date of Patent: May 16, 2023

(54) SEMICONDUCTOR DEVICE

(71) Applicant: Murata Manufacturing Co., Ltd., Kyoto-fu (JP)

(72) Inventors: Mari Saji, Nagaokakyo (JP); Masahiro Shibata, Nagaokakyo (JP); Atsushi Kurokawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 153 days.

(21) Appl. No.: 17/345,581

(22) Filed: Jun. 11, 2021

(65) Prior Publication Data

US 2021/0391233 A1 Dec. 16, 2021

(30) Foreign Application Priority Data

Jun. 16, 2020 (JP) .............................. JP2020-103785

(51) Int. Cl.
| | | |
|---|---|---|
| *H01L 23/36* | (2006.01) | |
| *H01L 23/48* | (2006.01) | |
| *H01L 23/00* | (2006.01) | |
| *H01L 29/737* | (2006.01) | |
| *H01L 29/205* | (2006.01) | |
| *H01L 29/06* | (2006.01) | |
| *H01L 29/417* | (2006.01) | |

(52) U.S. Cl.
CPC ............ *H01L 23/36* (2013.01); *H01L 23/481* (2013.01); *H01L 24/14* (2013.01); *H01L 29/737* (2013.01)

(58) Field of Classification Search
CPC ....... H01L 23/36; H01L 23/481; H01L 24/14; H01L 29/737; H01L 29/205; H01L 29/7371; H01L 24/03; H01L 29/0692; H01L 29/41708; H01L 23/49568; H01L 27/082

See application file for complete search history.

(56) References Cited

U.S. PATENT DOCUMENTS

2019/0006306 A1* 1/2019 Shibata ................... H01L 24/14

FOREIGN PATENT DOCUMENTS

| JP | 2003-077930 A | 3/2003 |
|---|---|---|
| JP | 2019-149485 A | 9/2019 |

* cited by examiner

*Primary Examiner* — Herve-Louis Y Assouman
(74) *Attorney, Agent, or Firm* — Studebaker & Brackett PC

(57) ABSTRACT

A first layer conductor film is connected to an operation electrode through an opening in a first layer interlayer insulating film. An opening in a second layer interlayer insulating film is encompassed by the first layer conductor film in plan view. A second layer conductor film is connected to the first layer conductor film through the opening in a second layer interlayer insulating film. The average, along a first direction, of distances in a second direction, which is perpendicular to the first direction, from the opening in the first layer interlayer insulating film to the side surface of the opening in the second layer interlayer insulating film is greater than or equal to a distance in a height direction from an upper opening plane of the opening in the first layer interlayer insulating film to a lower opening plane of the opening in the second layer interlayer insulating film.

6 Claims, 10 Drawing Sheets

SEMICONDUCTOR DEVICE

CROSS-REFERENCE TO RELATED APPLICATION

This application claims benefit of priority to Japanese Patent Application No. 2020-103785, filed Jun. 16, 2020, the entire content of which is incorporated herein by reference.

BACKGROUND

Technical Field

The present disclosure relates to a semiconductor device.

Background Art

There are demands for power amplifiers that are mainly used in wireless communication devices to have higher output powers, be smaller in size, and so forth. Transistors, such as heterojunction bipolar transistors (HBTs), are used as amplifying elements included in power amplifiers. There is a strong demand to improve heat dissipation in order to increase the output power of power amplifiers.

A semiconductor device that can suppress heat stress is disclosed in Japanese Unexamined Patent Application Publication No. 2019-149485. In the semiconductor device disclosed in Japanese Unexamined Patent Application Publication No. 2019-149485, an HBT is formed on a substrate and a bump is connected to an emitter electrode of the HBT via an emitter wiring and an emitter rewiring layer. The emitter wiring and emitter rewiring layer serve as a heat transfer path and the heat generated by the HBT is conducted from the emitter electrode to the bump along the heat transfer path.

SUMMARY

It is desirable to further improve heat dissipation as the power output of a power amplifier is improved. Accordingly, the present disclosure provides a semiconductor device that can realize improved heat dissipation.

An aspect of the present disclosure provides a semiconductor device that includes a substrate; a transistor that is provided on the substrate; an operation electrode that is disposed on the transistor and supplies an operation current to the transistor; and a plurality of interlayer insulating films and a plurality of conductor films that are stacked in an alternating manner on the transistor and the operation electrode. An opening is provided in each of the plurality of interlayer insulating films, seen from a side near the substrate. The opening in a first layer interlayer insulating film, among the plurality of interlayer insulating films, is shaped so as to be long in a first direction and is encompassed by the operation electrode in plan view. A first layer conductor film, among the plurality of conductor films, encompasses the opening in the first layer interlayer insulating film in plan view and is connected to the operation electrode via the opening in the first layer interlayer insulating film. The opening in a second layer interlayer insulating film, among the plurality of interlayer insulating films, is encompassed by the first layer conductor film in plan view and is disposed at a position such that a side surface of the opening in the second layer interlayer insulating film is further away than a side surface of the opening in the first layer interlayer insulating film when viewed in a second direction that is perpendicular to the first direction from the opening in the first layer interlayer insulating film. A second layer conductor film, among the plurality of conductor films, encompasses the opening in the second layer interlayer insulating film in plan view and is connected to the first layer conductor film through the opening in the second layer interlayer insulating film. A value obtained by averaging, along the first direction, distances in a second direction, which is perpendicular to the first direction, from the opening in the first layer interlayer insulating film to a side surface of the opening in the second layer interlayer insulating film is greater than or equal to a distance in a height direction from an upper opening plane of the opening in the first layer interlayer insulating film to a lower opening plane of the opening in the second layer interlayer insulating film.

Heat is conducted from the operation electrode to the second layer conductor film via the first layer conductor film. Heat can be allowed to be efficiently conducted from the operation electrode to the second layer conductor film via the first layer conductor film by disposing the opening in the first layer interlayer insulating film and the opening in the second layer interlayer insulating film in the above described manner. In this way, dissipation of heat from the transistor can be increased.

Other features, elements, characteristics and advantages of the present disclosure will become more apparent from the following detailed description of preferred embodiments of the present disclosure with reference to the attached drawings.

DETAILED DESCRIPTION

First Embodiment

Figure 1:
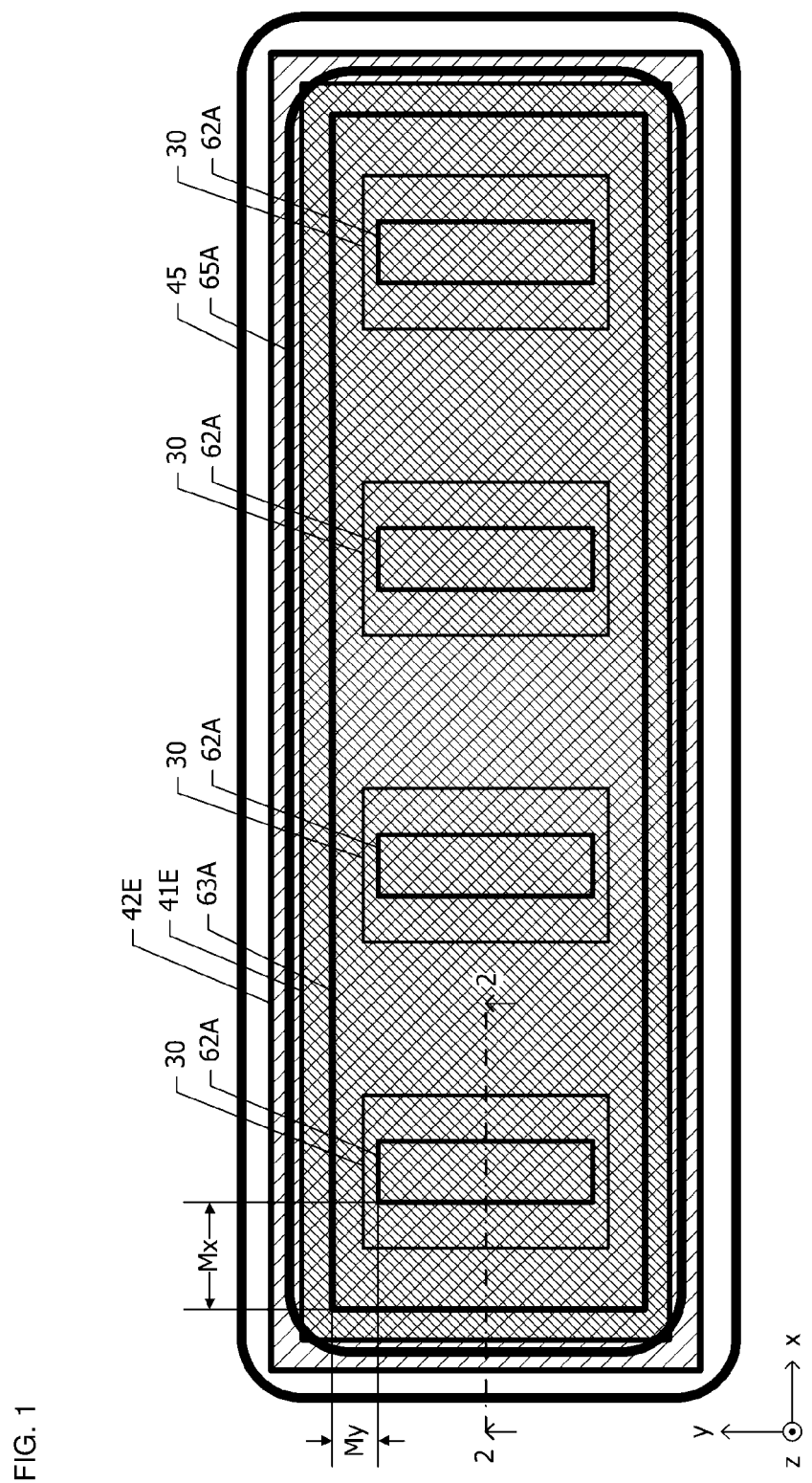
FIG. 1 is a schematic plan view of a semiconductor device according to a First Embodiment.

A semiconductor device according to a First Embodiment will be described while referring to FIGS. 1 and 2. FIG. 1 is a schematic plan view of the semiconductor device according to the First Embodiment. A plurality of transistors 30 are disposed on a substrate. An xyz Cartesian coordinate system is defined in which a surface of the substrate is taken to be an xy plane and a direction normal to the substrate is taken to be z direction. The plurality of transistors 30 are disposed so as to be arrayed in the x direction. Each of the transistors 30 is a heterojunction bipolar transistor (HBT) that includes a collector, a base, and an emitter.

A first layer conductor film (emitter wiring 41E) is disposed so as to encompass the plurality of transistors 30 in plan view. In FIG. 1, the first layer emitter wiring 41E is shaded with rightwardly upward hatching. The first layer emitter wiring 41E is connected to the emitters of the transistors 30 through openings 62A provided in an interlayer insulating film therebelow. The openings 62A are provided for all the transistors 30 and each opening 62A is substantially shaped so as to be long in the y direction. For example, the shape of each opening 62A in plan view is substantially a rectangular shape, a rounded-corner rectangular shape, or a racetrack shape that is long in the y direction. In each of these cases, the edge of each opening 62A includes two parts that are parallel to the y direction and parts that connect end portions of these two parts to each other in the x direction.

Furthermore, a second layer conductor film (emitter wiring 42E) is disposed so as to encompass the first layer emitter wiring 41E in plan view. In FIG. 1, the second layer emitter wiring 42E is shaded with rightwardly downward hatching that is more widely spaced than that of the emitter wiring 41E. The second layer emitter wiring 42E is connected to the first layer emitter wiring 41E through an opening 63A provided in an interlayer insulating film disposed therebelow. In plan view, the opening 63A is substantially shaped so as to be long in the x direction and the one opening 63A encompasses the plurality of openings 62A. For example, the shape of the opening 63A in plan view is substantially a rectangular shape or a rounded-corner rectangular shape that is long in the x direction. In each of these cases as well, the edge of the opening 63A includes two parts that are parallel to the x direction and two parts that are parallel to the y direction.

The distance in the x direction from each of the openings 62A located at the two ends among the plurality of openings 62A to the edge (side surface) of the opening 63A is denoted as Mx. The distance in the y direction from each of the plurality of openings 62A to the edge (side surface) of the opening 63A is denoted as My.

Furthermore, a bump 45 is disposed so as to encompass the second layer emitter wiring 42E. A protective film is disposed between the second layer emitter wiring 42E and the bump 45 and an opening 65A is provided in the protective film. The bump 45 is connected to the second layer emitter wiring 42E through the opening 65A. The opening 65A is encompassed by the second layer emitter wiring 42E and encompasses the opening 63A in plan view.

Figure 2:
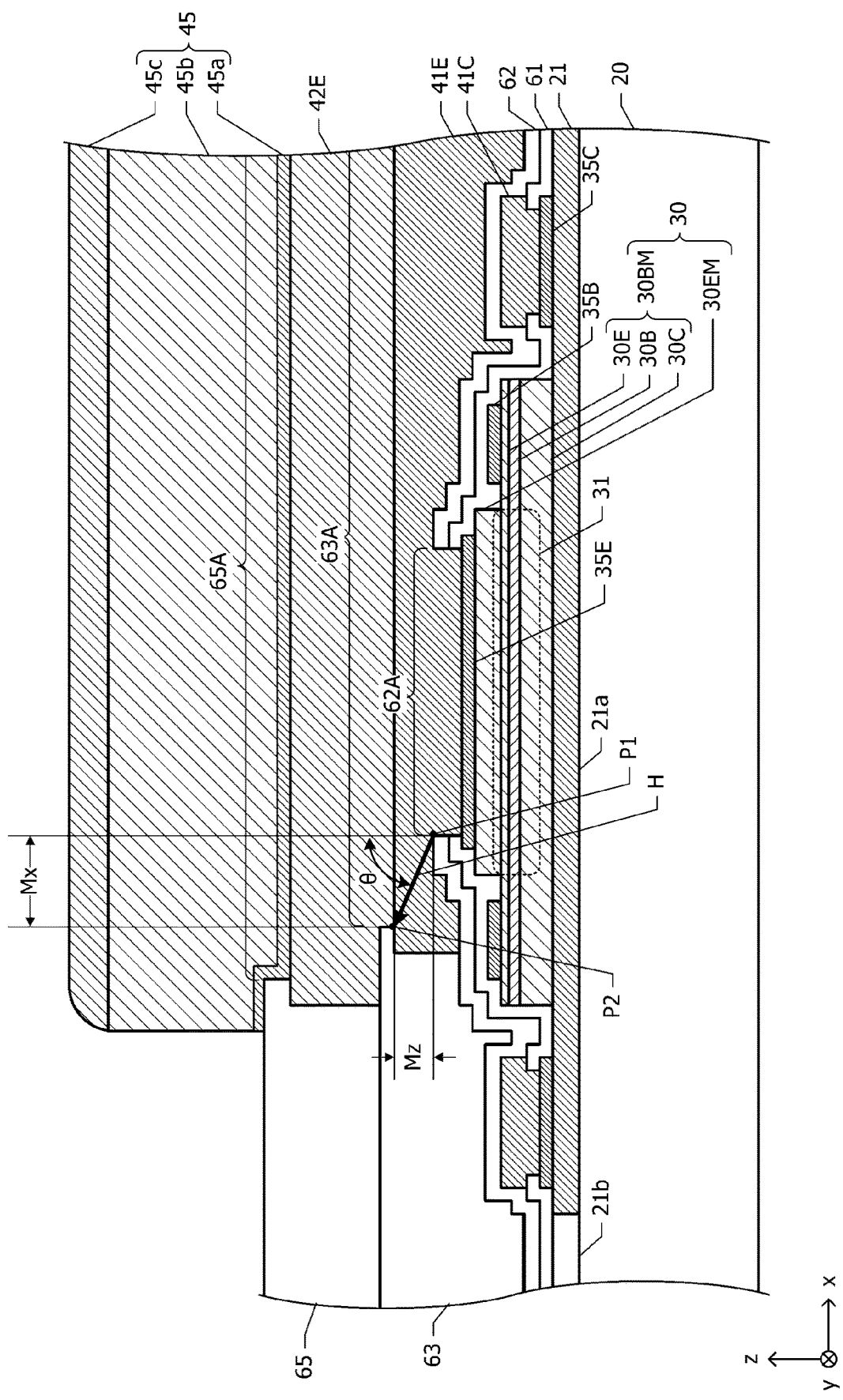
FIG. 2 is a sectional view taken along a one-dot chain line 2-2 in FIG. 1.

FIG. 2 is a sectional view taken along a one-dot chain line 2-2 in FIG. 1. A sub collector layer 21 composed of semi-insulating GaAs is disposed on a substrate 20 that is composed of GaAs. The sub collector layer 21 is divided into an element forming region 21a composed of n-type GaAs or the like and an insulating element isolating region 21b.

The plurality of transistors 30 are disposed on the element forming region 21a. In FIG. 2, only one transistor 30 is illustrated. Each of the plurality of transistors 30 includes a base mesa portion 30BM and an emitter mesa portion 30EM that is disposed on part of the upper surface of the base mesa portion BM. The emitter mesa portion 30EM is substantially shaped so as to be long in the y direction in plan view. The base mesa portion 30BM includes a collector layer 30C, a base layer 30B, and an emitter layer 30E, which are stacked in order from the side near the substrate 20. For example, the collector layer 30C is formed of n-type GaAs, the base layer 30B is formed of p-type GaAs, and the emitter layer 30E is formed of n-type InGaP. The emitter mesa portion 30EM is formed of a layer composed of high-concentration n-type GaAs and a layer composed of high-concentration n-type InGaAs disposed on the n-type GaAs layer, for example.

An emitter electrode 35E is disposed on the emitter mesa portion 30EM. The emitter electrode 35E is connected to the emitter layer 30E through the emitter mesa portion 30EM. The emitter electrode 35E is also substantially shaped so as to be long in the y direction similarly to the emitter mesa portion 30EM. The emitter electrode 35E is formed of Ti, for example.

A base electrode 35B is disposed on a region of the upper surface of the base mesa portion 30BM where the emitter mesa portion 30EM is not disposed. In the cross section illustrated in FIG. 2, the base electrode 35B is disposed at a position across from the emitter mesa portion 30EM in the x-axis direction and is connected to the base layer 30B through an alloyed region that penetrates through the emitter layer 30E. The base electrode 35B is, for example, formed of three layers consisting of a Ti film, a Pt film, and a Au film stacked in order from the bottom.

A collector electrode 35C is disposed on a region of the upper surface of the element forming region 21a where the base mesa portion 30BM is not disposed. The collector electrode 35C is connected to the collector layer 30C through the element forming region 21a. The collector electrode 35C is, for example, formed of three layers consisting of a AuGe film, a Ni film, and a Au film stacked in order from the bottom.

An operation current substantially flows in regions of the collector layer 30C, the base layer 30B, and the emitter layer 30E that overlap the emitter mesa portion 30EM in plan view. The region in which the operation current substantially flows is referred to as an operation region 31. In FIG. 2, the operation region 31 is indicated by a broken line. The emitter electrode 35E is referred to as an operation electrode. The operation electrode is formed of an electrically conductive material having a higher thermal conductivity than the semiconductor regions of the transistor 30 such as a metal. When the transistor 30 is made to operate, heat is mainly generated in the operation region 31.

An interlayer insulating film 61 is disposed so as to cover the sub collector layer 21, the transistor 30, the collector electrode 35C, the base electrode 35B, and the emitter electrode 35E. The interlayer insulating film 61 is formed of an inorganic insulating material such as SiO or SiN. A first layer collector wiring 41C is disposed on the interlayer insulating film 61. The collector wiring 41C is connected to the collector electrode 35C through an opening provided in the interlayer insulating film 61. The collector wiring 41C is formed of two layers consisting of a Ti film and a Au film stacked on the Ti film, for example.

An interlayer insulating film 62 is disposed so as to cover the interlayer insulating film 61 and the collector wiring 41C. The interlayer insulating film 62 is formed of an inorganic insulating material such as SiO or SiN similarly to the underlying interlayer insulating film 61. The opening 62A is provided in the two layers of the interlayer insulating films 61 and 62. The opening 62A is encompassed by the emitter electrode 35E and is substantially shaped so as to be long in the y direction in plan view. The first layer emitter wiring 41E is disposed inside the opening 62A and on the interlayer insulating film 62. The first layer emitter wiring 41E is connected to the emitter electrode 35E through the opening 62A. The emitter wiring 41E is formed of two layers consisting of a Ti film and a Au film stacked on the Ti film, for example. The first emitter wiring 41E overlaps the first layer collector wiring 41C in plan view, but the overlapping parts thereof are insulated from each other by the interlayer insulating film 62.

At the overlapping parts of the emitter electrode 35E and the base electrode 35B and the first layer emitter wiring 41E, the two interlayer insulating films 61 and 62 may be collectively regarded as a first layer interlayer insulating film.

An interlayer insulating film 63 is disposed on the first layer emitter wiring 41E. The interlayer insulating film 63 is formed of two layers, namely, an inorganic insulating film composed of an inorganic insulating material such as SiO or SiN and an organic insulating film composed of an organic insulating material such as benzocyclobutene. Note that the interlayer insulating film 62 disposed below the first emitter wiring 41E may be formed of two layers consisting of an inorganic insulating film and an organic insulating film.

The opening 63A is provided in the interlayer insulating film 63. The opening 63A is encompassed by the first layer emitter wiring 41E in plan view. The emitter wiring 42E, which is the second layer conductor film, is disposed inside the opening 63A and on the interlayer insulating film 63. The second layer emitter wiring 42E is formed of two layers consisting of a Ti film and a Au film stacked on the Ti film, for example. A Cu film or an Al film may be used instead of the Au film. The second layer emitter wiring 42E is connected to the first layer emitter wiring 41E through the opening 63A.

A protective film 65 is disposed on the second layer emitter wiring 42E. The opening 65A is provided in the protective film 65. The opening 65A is encompassed by the second layer emitter wiring 42E in plan view. The protective film 65 is formed of two layers consisting of an inorganic insulating film and an organic insulating film. The bump 45 is disposed inside the opening 65A and on the protective film 65. The bump 45 is formed of three layers consisting of an under bump metal layer 45a, a conductor pillar 45b thereabove, and a solder layer 45c at the top.

The bump 45 is connected to the second layer emitter wiring 42E through the opening 65A. A high melting point metal such as Ti or TiW is used for the under bump metal layer 45a. For example, copper (Cu) is used for the conductor pillar 45b. Solder containing tin (Sn) such as Sn or SnAg is used for the solder layer 45c. A diffusion preventing layer may be disposed between the conductor pillar 45b and the solder layer 45c in order to prevent the solder material of the solder layer 45c from thermally diffusing into the conductor pillar 45b. Ni, Ti, W, TiW, or the like can be used for the diffusion preventing layer.

The semiconductor device is electrically and mechanically connected to a module substrate by connecting the bumps 45 and lands of the module substrate (mounting substrate) to each other. An operation current flows from the element forming region 21a of the sub collector layer 21 to the emitter electrode 35E when the transistor 30 is operating. Therefore, when the transistor 30 is used as a power transistor for amplifying a signal, the operation region 31 is the main source of heat generation. The heat generated by the operation region 31 is conducted to the module substrate along a heat dissipation path consisting of the emitter electrode 35E, the first layer emitter wiring 41E, the second layer emitter wiring 42E, and the bump 45.

Next, the preferred positional relationship between the opening 62A and the opening 63A in order to ensure good heat dissipation characteristics will be described. Heat generated by the operation region 31 is conducted to the bump 45 via the emitter electrode 35E, the emitter wiring 41E inside the opening 62A, the emitter wiring 41E on the interlayer insulating film 62, the emitter wiring 42E inside the opening 63A, and the emitter wiring 42E on the interlayer insulating film 63. The first layer emitter wiring 41E functions as a heat spreader that conducts heat from the emitter electrode 35E to the second layer emitter wiring 42E.

Heat conducted in the height direction (positive z-axis direction) through the emitter wiring 41E inside the opening 62A passes through the upper opening plane of the opening 62A and is then conducted in the height direction while spreading in in-plane directions of the substrate 20. To improve the heat dissipation effect, the heat spreader preferably extends to at least a 45° inclination with respect to the height direction. That is, in a cross section perpendicular to the y direction, an angle θ between the positive z-axis direction and a vector H from an upper edge P1 of the side surface of the opening 62A to a lower edge P2 of the side surface of the opening 63A is preferably greater than or equal to 45°.

The distance in the x direction from the opening 62A to the side surface of the opening 63A corresponds to the distance Mx in FIG. 1. A distance in the z direction (height direction) from the upper opening plane of the opening 62A to the lower opening plane of the opening 63A is denoted as Mz. The position, in the z direction, of the upper opening plane of the opening 62A is the same as the position of the upper surface of the part of the interlayer insulating film 62 that is adjacent to the opening 62A. The position, in the z direction, of the lower opening plane of the opening 63A is the same as the position of the lower surface of the part of the interlayer insulating film 63 that is adjacent to the opening 63A. Making the angle θ greater than or equal to 45° is equivalent to making the lateral distance Mx greater than or equal to the height direction distance Mz. In the First Embodiment, the openings 62A and 63A are disposed so that the x direction distance Mx is greater than or equal to the height direction distance Mz.

Next, the relationship between the distance My (FIG. 1) in the y-direction from each of the plurality of openings 62A to the side surface of the opening 63A, and the distance Mz in the height direction will be described. The y direction distance My is the same for each of the plurality of openings 62A. The openings 62A and 63A are disposed such that the y direction distance My is greater than or equal to the height direction distance Mz.

If the side surfaces of the openings 62A and 63A are inclined with respect to the xy plane, the points where the distance Mx in the x direction is the shortest are used as reference points for measuring the distance Mx. The same applies to the distance My in the y direction.

Next, advantageous effects of the First Embodiment will be described. In the First Embodiment, the lateral direction distances Mx and My of the part that functions as a heat spreader are larger than the height direction distance Mz, and therefore heat generated by the operation region 31 can be efficiently conducted. Since the opening 62A is substantially shaped so as to be long in the y direction in plan view, the amount of heat transfer in the x direction is greater than the amount of heat transfer in the y direction when heat generated in the operation region 31 is conducted in the height direction. Therefore, it is more effective to make the distance Mx in the x direction longer than the distance Mz in the height direction than to make the distance My in the y direction greater than or equal to the distance Mz in the height direction.

In addition, since the opening 65A encompasses the opening 63A in plan view, the cross-sectional area of the opening part of the heat transfer path that extends from the first layer emitter wiring 41E to the bump 45 via the second layer emitter wiring 42E becomes progressively larger from the upstream side to the downstream side in the flow of heat. Therefore, heat generated in the operation region 31 and conducted to the first layer emitter wiring 41E can be effectively conducted to the bump 45.

Figure 3:
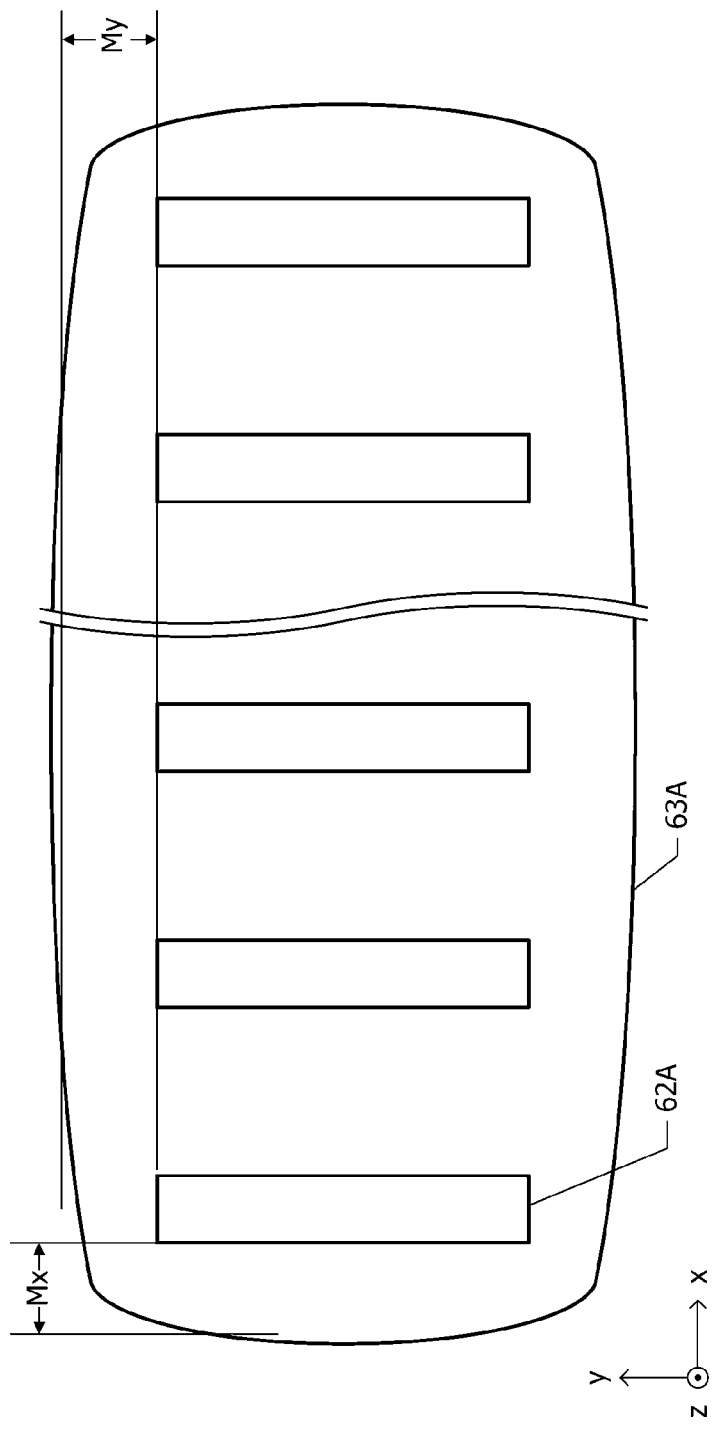
FIG. 3 is a plan view illustrating a plurality of openings of a semiconductor according to a modification of the First Embodiment.

Next, a modification of the First Embodiment will be described while referring to FIGS. 3, 4, and 5. FIG. 3 is a plan view illustrating a plurality of openings 62A and an opening 63A of a semiconductor device according to a modification of the First Embodiment. In the First Embodiment, straight parts of the edge of the opening 63A that are parallel to the y direction and straight parts of the edge of the opening 63A that are parallel to the x direction are used as references for respectively measuring the distance Mx in the x direction and the distance My in the y direction. In contrast, in this modification, the edge of the opening 63A substantially has the shape of a rectangle in which the sides bulge outward.

Therefore, the distance in the x direction from the openings 62A located at the two ends among the plurality of openings 62A arrayed in the x direction to the edge of the opening 63A is not constant. In this case, a value obtained by averaging distances in the x direction from the openings 62A to the side surface of the opening 63A along the y direction may be used as the distance Mx. In addition, the distance My in the y direction is not the same for each of the plurality of openings 62A. In this case, a value obtained by averaging the distances in the y direction from the plurality of openings 62A to the edge (side surface) of the opening 63A across the plurality of apertures 62A may be used as the distance My.

Figure 4:
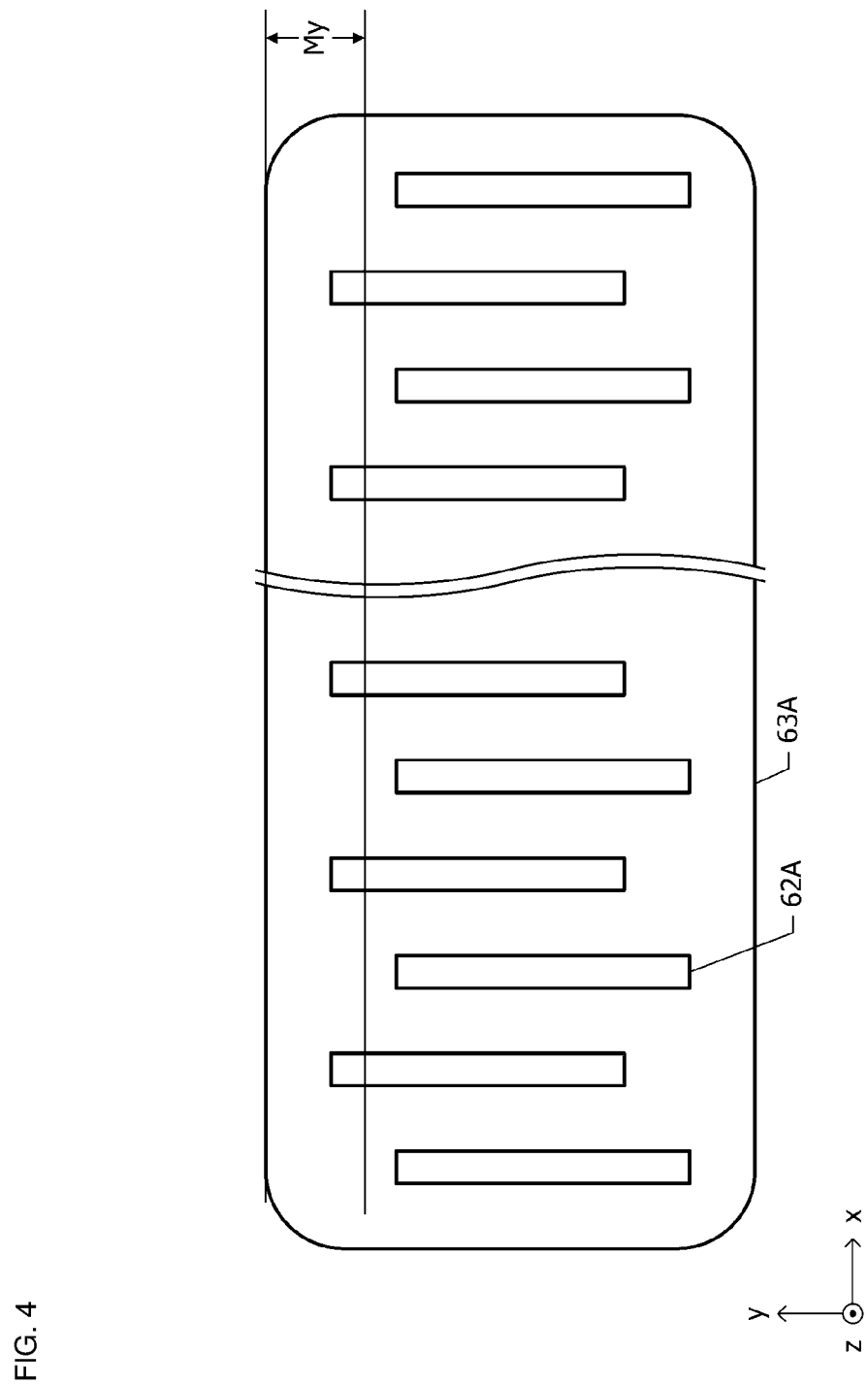
FIG. 4 is a plan view illustrating a plurality of openings of a semiconductor according to another modification of the First Embodiment.

FIG. 4 is a plan view illustrating a plurality of openings 62A and an opening 63A of a semiconductor device according to another modification of the First Embodiment. In the First Embodiment, the positions of the end portions of the plurality of openings 62A in the y direction are identical across the plurality of openings 62A. In contrast, in this modification, the positions of the end portions of the plurality of openings 62A in the y direction vary across the plurality of openings 62A. In this case as well, similar to the modification illustrated in FIG. 3, a value obtained by averaging the distances in the y direction from the plurality of openings 62A to the edge (side surface) of the opening 63A across the plurality of apertures 62A may be used as the distance My.

Figure 5:
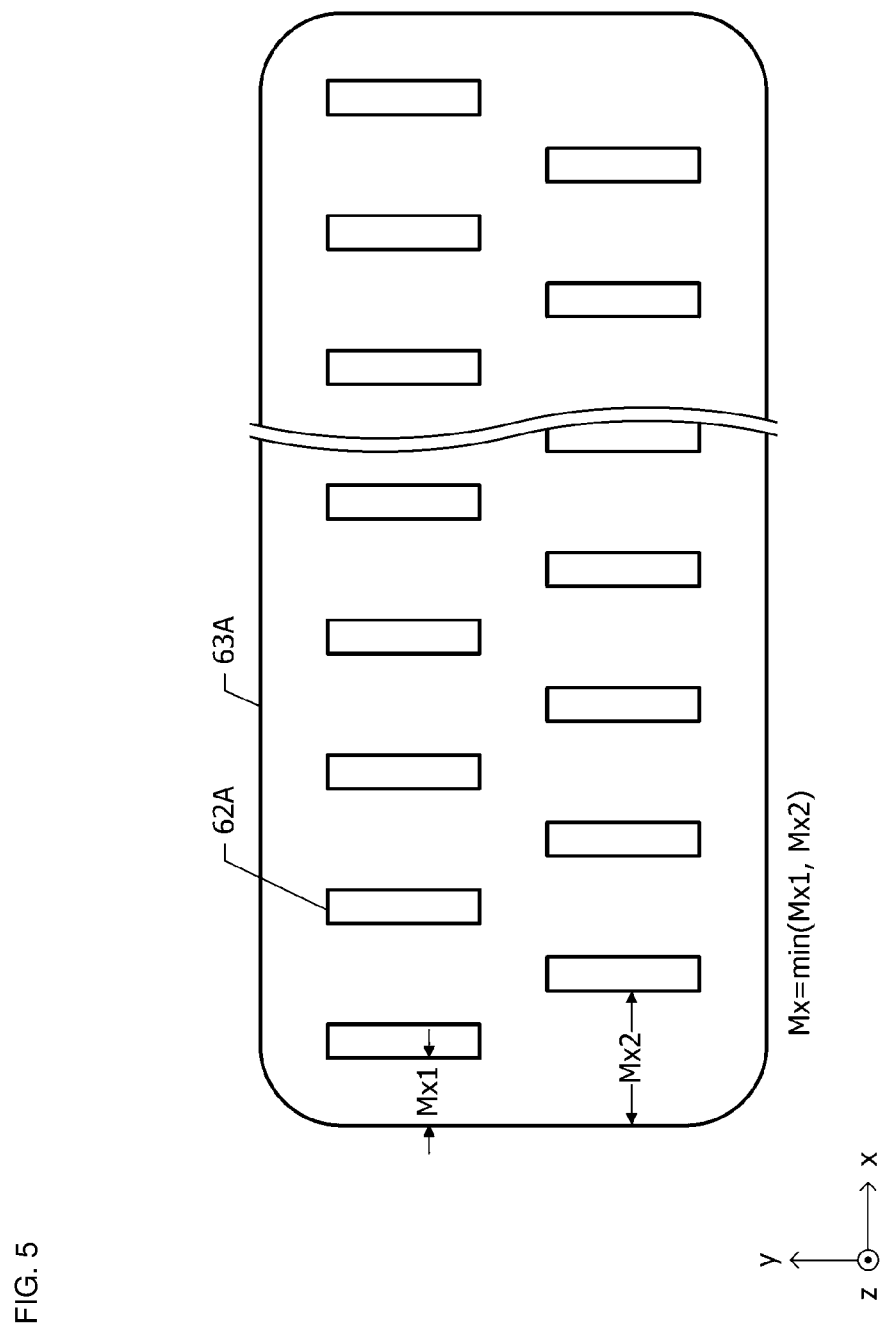
FIG. 5 is a plan view illustrating a plurality of openings of a semiconductor according to yet another modification of the First Embodiment.

FIG. 5 is a plan view illustrating a plurality of openings 62A and an opening 63A of a semiconductor device according to yet another modification of the First Embodiment. In the First Embodiment, a plurality of openings 62A are disposed in a row, whereas in this modification, a plurality of openings 62A are disposed in two rows in the x direction. The positions of the openings 62A of one row and the positions of the openings 62A of the other row are shifted from each other in the x direction. In other words, a distance Mx1 in the x direction from the opening 62A disposed at the end of one row to the edge of the opening 63A and a distance Mx2 in the x direction from the opening 62A disposed at the end of the other row to the edge of the opening 63A are different from each other. In this case, the shorter distance among the distance Mx1 and the distance Mx2 may be used as the distance Mx.

Next, yet another modification of the First Embodiment will be described. The second layer emitter wiring 42E may be used as wiring of a rewiring layer for increasing the degree of freedom in terms of the position of the bump. In the First Embodiment, an HBT is used as the transistor 30, but other types of transistor such as a homojunction bipolar transistor, a field effect transistor, and so on may also be used.

In the First Embodiment, the opening 63A (FIG. 1) encompasses the underlying opening 62A in plan view, but part of the opening 62A may extend to outside the opening 63A. However, in the cross section illustrated in FIG. 2, the side surface of the opening 63A is located further toward the outside than the side surface of the opening 62A. In other words, the side surface of the opening 63A of the interlayer insulating film 63 is disposed at a position that is further away than the side surface of the opening 62A of the interlayer insulating films 61 and 62 when looking in the x direction from the opening 62A of the interlayer insulating films 61 and 62. With this configuration, heat is conducted from the operation region 31 to the bump 45 can be allowed to diffuse in the x direction.

Second Embodiment

Next, a semiconductor device according to a Second Embodiment will be described while referring to FIG. 6. Hereafter, description of parts of the configuration that are common to the semiconductor device according to the First Embodiment (FIGS. 1 and 2) will be omitted.

Figure 6:
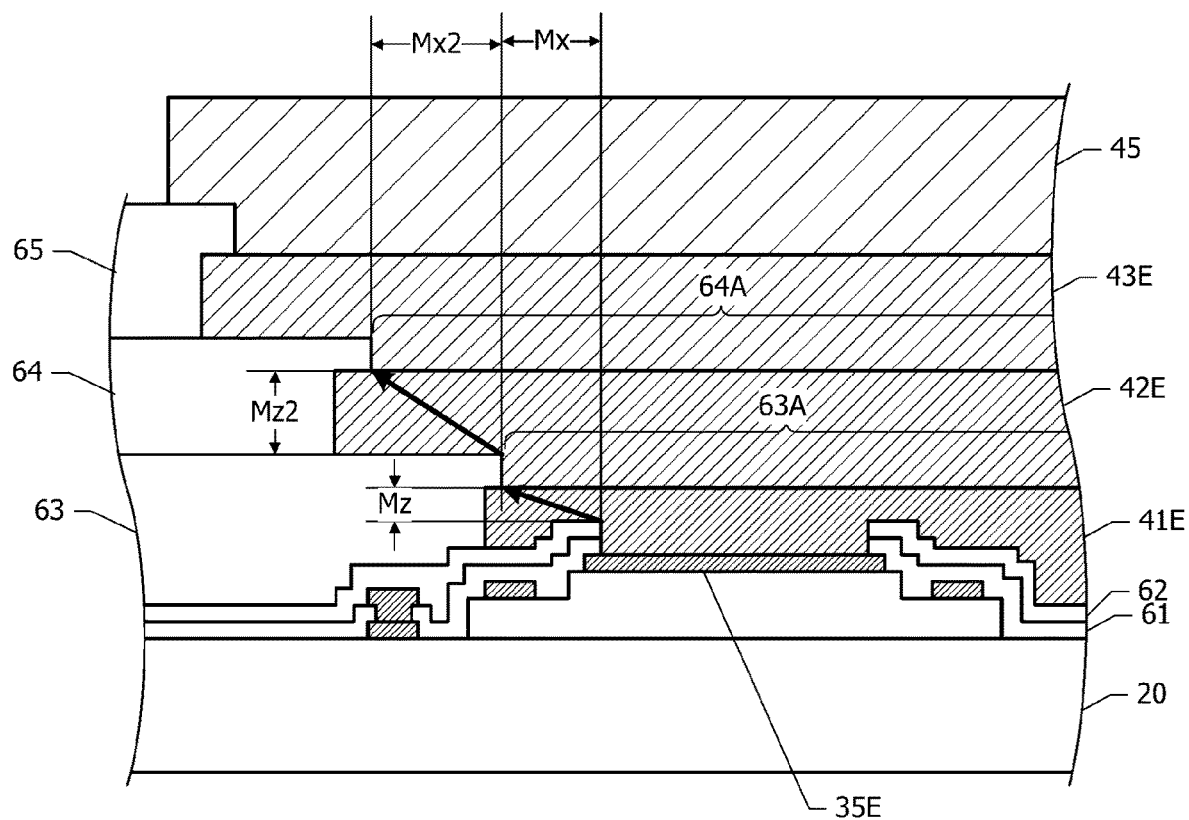
FIG. 6 is a sectional view of a semiconductor device according to a Second Embodiment.

FIG. 6 is a sectional view of the semiconductor device according to the Second Embodiment. In the First Embodiment, a two-layer conductor film consisting of the first layer emitter wiring 41E and the second layer emitter wiring 42E is disposed between the emitter electrode 35E and the bump 45. In contrast, in the Second Embodiment, an interlayer insulating film 64 and a third layer emitter wiring 43E are additionally disposed between the second layer emitter wiring 42E and the bump 45. The third layer emitter wiring 43E is connected to the second layer emitter wiring 42E through an opening 64A provided in the interlayer insulating film 64. The opening 64A encompasses the opening 63A in plan view.

A distance in the x direction from the opening 63A to the side surface of the opening 64A is denoted as Mx2. A distance in the z direction (height direction) from the upper opening plane of the opening 63A to the lower opening plane of the opening 64A is denoted as Mz2. The opening 63A and the opening 64A are disposed so that the distance Mx2 is greater than or equal to the distance Mz2 similarly to the relationship between the distance Mx and the distance Mz.

Next, advantageous effects of the Second Embodiment will be described. In the Second Embodiment, the second layer emitter wiring 42E functions as a heat spreader in a heat transfer path from the first layer emitter wiring 41E to the third layer emitter wiring 43E. It is possible to make heat be efficiently conducted from the first layer emitter wiring 41E to the third layer emitter wiring 43E by making the distance Mx2 greater than or equal to the distance Mz2. Thus, it is possible to suppress a decrease in heat dissipation caused by increasing the number of conductor films.

Next, a modification of the second embodiment will be described. In the semiconductor device according to the Second Embodiment, three layers of interlayer insulating films and three layers of conductor films are disposed in an alternating manner between the emitter electrode 35E and the bump 45, but alternatively four or more layers of interlayer insulating films and four or more layers of conductor films may be disposed in an alternating manner between the emitter electrode 35E and the bump 45. In this case, it is preferable that a plurality of openings be provided so that the opening in the interlayer insulating film of a certain layer, among the plurality of interlayer insulating films, encompasses the opening of the interlayer insulating film of a layer therebelow in plan view. The opening of the interlayer insulating film of a certain layer among the plurality of interlayer insulating films may encompass the opening of an interlayer insulating film of a layer therebelow with respect to the x direction. In other words, both ends, in the x direction, of the opening of one interlayer insulating film being focused on among the plurality of interlayer insulating films may be located further toward the outside than both ends, in the x direction, of the opening of an interlayer insulating film therebelow.

Furthermore, it is preferable that the plurality of openings be provided so that the distance in the x direction from the opening of the interlayer insulating film of one layer being focused on among the plurality of interlayer insulating films to the side surface of the opening of the interlayer insulating film one layer thereabove be greater than or equal to the distance in the z direction from the upper opening plane of the opening of the interlayer insulating film being focused on to the lower opening plane of the opening of the interlayer insulating film one layer thereabove. By providing the plurality of openings in this manner, it is possible to suppress a reduction in heat dissipation caused by the number of conductor films being increased.

Third Embodiment

Next, a semiconductor device according to a Third Embodiment will be described while referring to FIG. 7. Hereafter, description of parts of the configuration that are common to the semiconductor device according to the First Embodiment (FIGS. 1 and 2) will be omitted.

Figure 7:
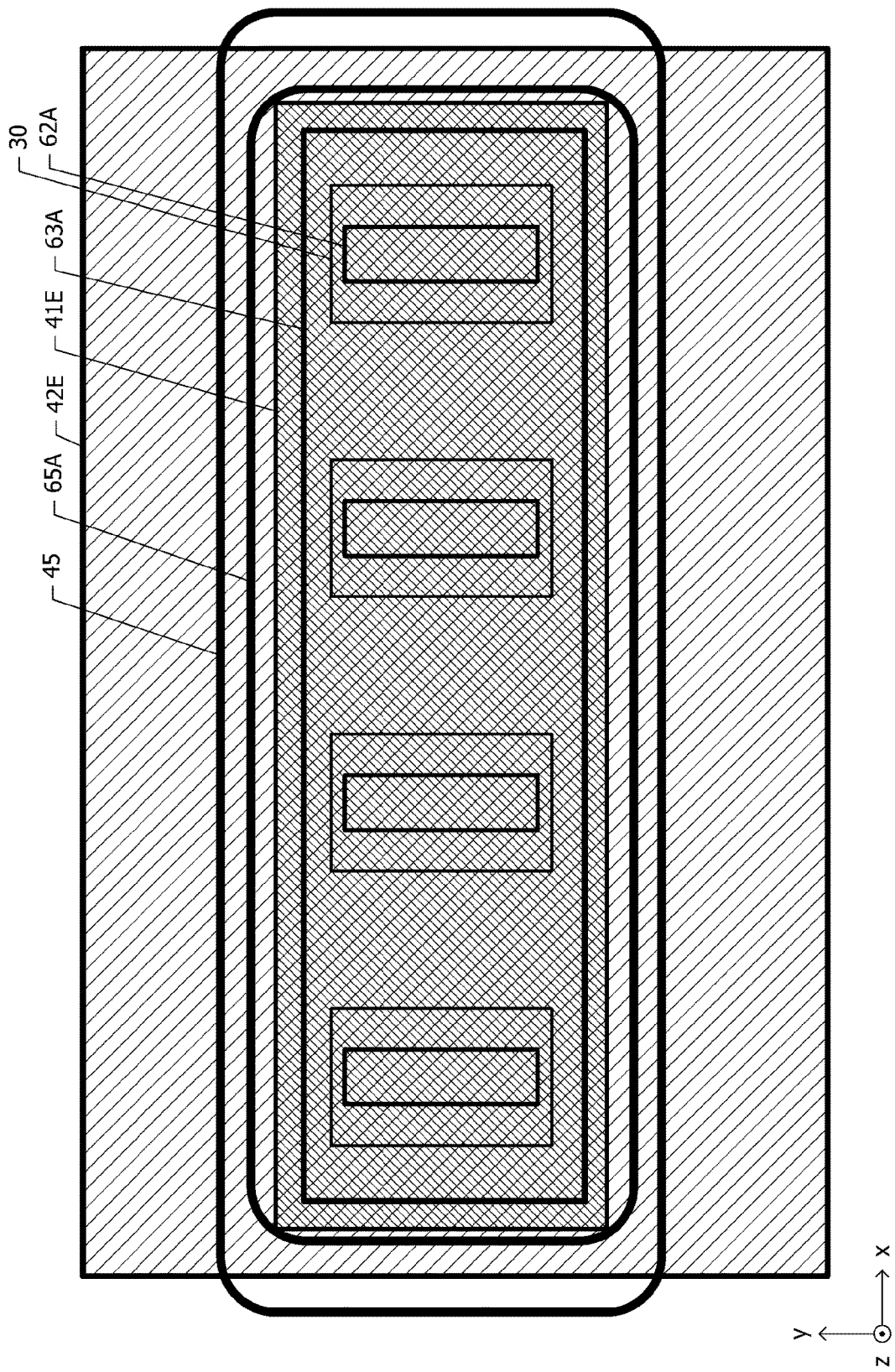
FIG. 7 is a schematic plan view of a semiconductor device according to a Third Embodiment.

FIG. 7 is a schematic plan view of the semiconductor device according to the Third Embodiment. The arrangements of the plurality of transistors 30, the first layer emitter wiring 41E, and the plurality of openings 62A are the same as those in the semiconductor device according to the First Embodiment (FIG. 1). The second layer emitter wiring 42E encompasses the first layer emitter wiring 41E in plan view. The opening 63A provided in the interlayer insulating film 63 (FIG. 1) between the first layer emitter wiring 41E and the second layer emitter wiring 42E is encompassed by the first layer emitter wiring 41E in plan view. The plurality of openings 62A are encompassed by one opening 63A in plan view.

The bump 45 encompasses the plurality of openings 62A in plan view. The opening 65A, which is provided in the protective film 65 (FIG. 2) between the second layer emitter wiring 42E and the bump 45, is encompassed by the second layer emitter wiring 42E in plan view. The opening 63A is encompassed by the opening 65A for the bump in plan view. The area of the second layer emitter wiring 42E in plan view is larger than the area of the bump 45.

Next, advantageous effects of the third embodiment will be described. In the third embodiment, the area of the second emitter wiring 42E (uppermost conductor film) is larger than the area of the bump 45 in plan view. Therefore, the amount of heat dissipated from the second layer emitter wiring 42E itself is increased. As a result, heat dissipation from the operation region 31 (FIG. 2) can be improved.

Fourth Embodiment

Next, a semiconductor device according to a Fourth Embodiment will be described while referring to FIGS. 8 and 9. Hereafter, description of parts of the configuration that are common to the semiconductor device according to the First Embodiment (FIGS. 1 and 2) will be omitted.

Figure 8:
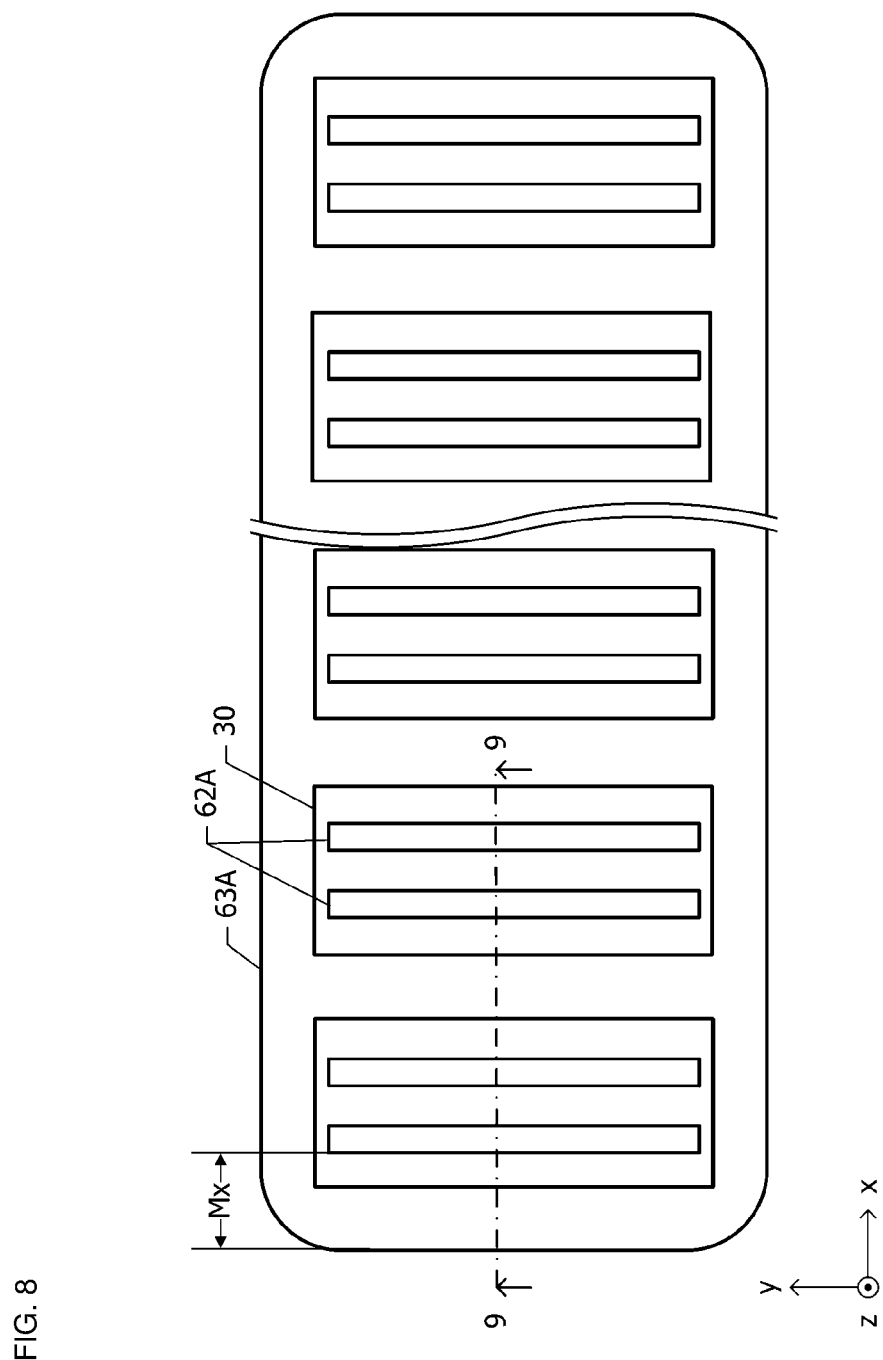
FIG. 8 is a schematic plan view of a semiconductor device according to a Fourth Embodiment.

FIG. 8 is a schematic plan view of the semiconductor device according to the Fourth Embodiment. In the First Embodiment, one emitter mesa portion 30EM (FIG. 2) is provided for each of the plurality of transistors 30. In contrast, in the Fourth Embodiment, two emitter mesa portions 30EM are provided for each of the plurality of transistors 30 and one opening 62A is disposed for each emitter mesa portion 30EM.

Figure 9:
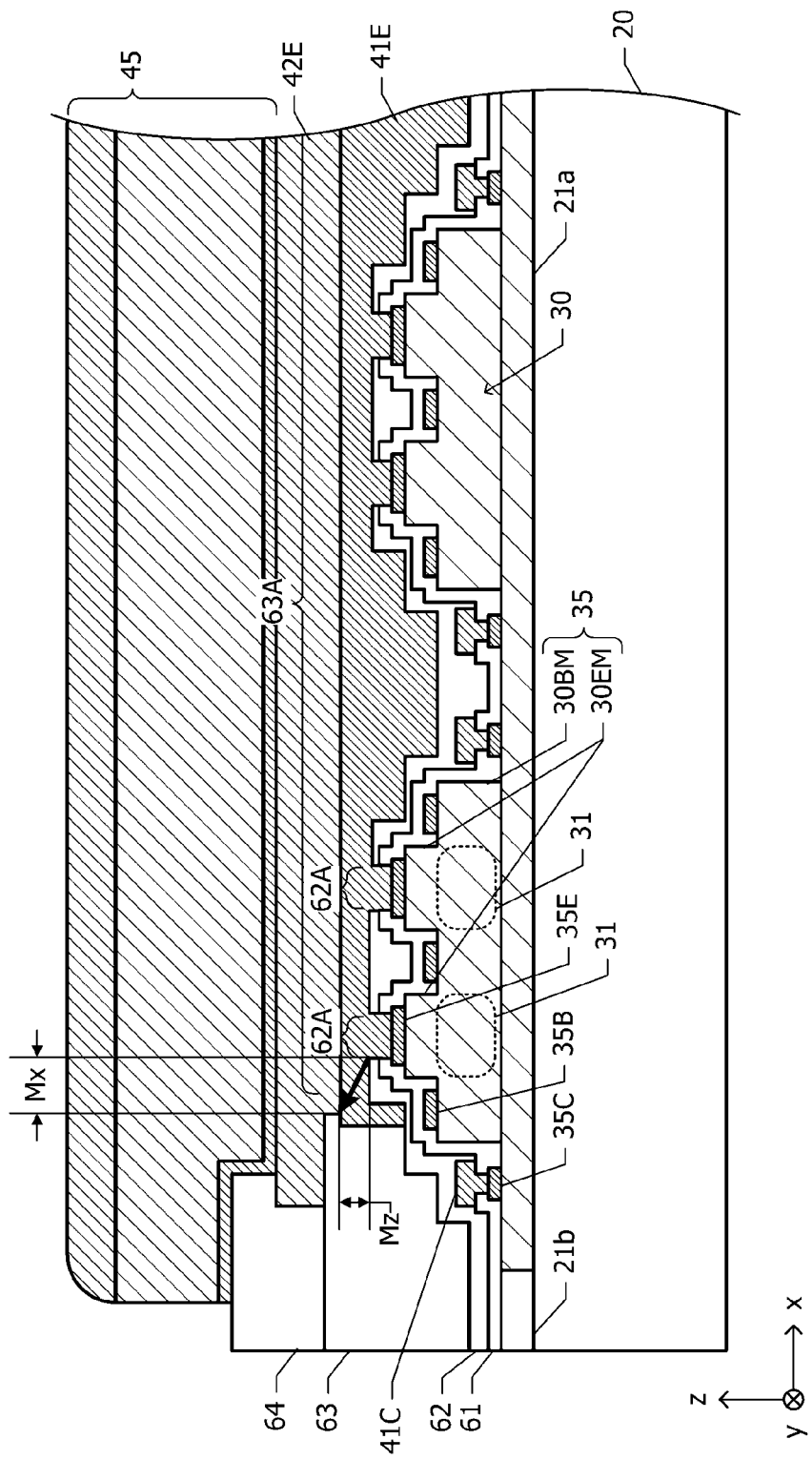
FIG. 9 is a sectional view taken along a one-dot chain line 9-9 in FIG. 8.

FIG. 9 is a sectional view taken along a one-dot chain line 9-9 in FIG. 8. Two emitter mesa portions 30EM are disposed on one base mesa portion 30BM. The two emitter mesa portions 30EM are disposed next to each other in the x direction. The emitter electrode 35E is disposed on each of the emitter mesa portions 30EM and an opening 62A is disposed so as to correspond to each of the emitter electrodes 35E. Two operation regions 31 that correspond to two emitter mesa portions 30EM are defined in each transistor 30.

The distance Mx from the opening 62A that is disposed at the end among the plurality of openings 62A (FIG. 8) arrayed in the x direction to the edge of the opening 63A is greater than or equal to the distance Mz in the z direction from the upper opening plane of the opening 62A to the lower opening plane of the opening 63A.

Next, advantageous effects of the fourth embodiment will be described. In the Fourth Embodiment as well, similarly to as in the First Embodiment, heat generated by the operation regions 31 can be efficiently dissipated.

Next, a modification of the Fourth Embodiment will be described. In the Fourth Embodiment, two emitter mesa portions 30EM are provided in one transistor 30, but alternatively three or more emitter mesa portions 30EM may be provided in one transistor 30. In this case, the emitter electrode 35E and the opening 62A are disposed for each emitter mesa portion 30EM.

Fifth Embodiment

Next, a semiconductor device according to a Fifth Embodiment will be described while referring to FIG. 10. Hereafter, description of parts of the configuration that are common to the semiconductor device according to the First Embodiment (FIGS. 1 and 2) will be omitted.

Figure 10:
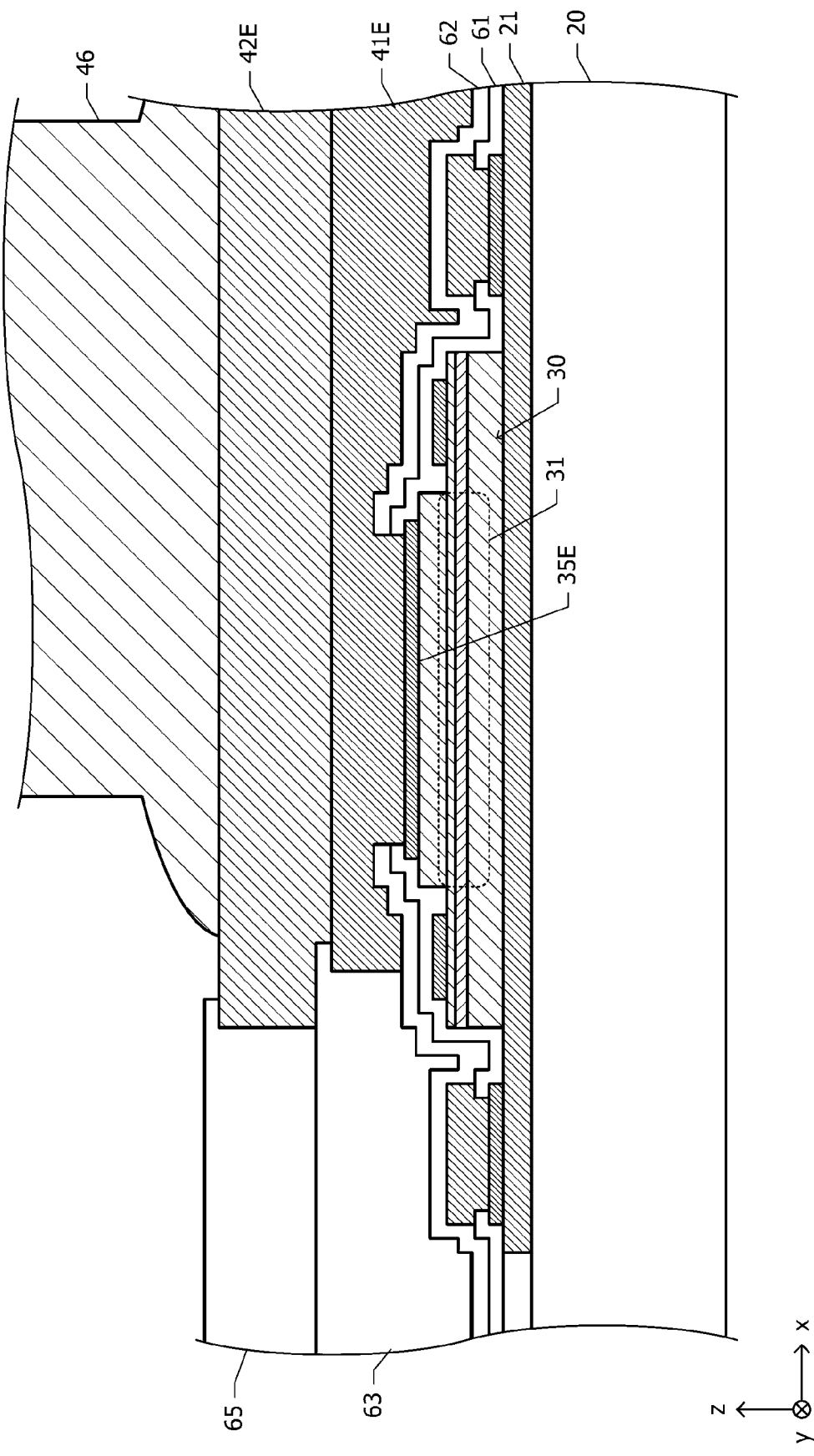
FIG. 10 is a schematic sectional view of a semiconductor device according to a Fifth Embodiment.

FIG. 10 is a schematic sectional view of the semiconductor device according to the Fifth Embodiment. In the First Embodiment, the bump 45 (FIG. 2) is disposed on the uppermost emitter wiring 42E. In contrast, in the Fifth Embodiment, part of the uppermost emitter wiring 42E is used as a pad for external connection. A bonding wire 46 is bonded to the pad, which is part of the uppermost emitter wiring 42E, when mounting the semiconductor device on a package substrate.

Next, advantageous effects of the Fifth Embodiment will be described. In the Fifth Embodiment as well, similarly to as in the First Embodiment, heat can be efficiently conducted from the emitter electrode 35E to the second layer emitter wiring 42E (pad) via the first layer emitter wiring 41E. Heat conducted to the second layer emitter wiring 42E is dissipated from the emitter wiring 42E. In addition, the bonding wire 46 functions as a heat transfer path that extends from the emitter wiring 42E to the package substrate. Therefore, dissipation of heat from the operation region 31 can be improved.

Each of the above-described embodiments is an illustrative example and it goes without saying that parts of the configurations illustrated in different embodiments can be substituted for one another or combined with each other. The same operational effects resulting from the same configurations in a plurality of embodiments are not repeatedly described in the individual embodiments. In addition, the present disclosure is not limited to the above-described embodiments. For example, it will be clear to a person skilled in the art that various changes, improvements, and combinations are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
    a substrate;
    a transistor that is provided on the substrate;
    an operation electrode that is disposed on the transistor and configured to supply an operation current to the transistor; and
    a plurality of interlayer insulating films and a plurality of conductor films that are stacked in an alternating manner on the transistor and the operation electrode,
    wherein an opening is provided in each of the plurality of interlayer insulating films,
    seen from a side near the substrate, the opening in a first layer interlayer insulating film, among the plurality of interlayer insulating films, is shaped so as to be long in a first direction and is encompassed by the operation electrode in plan view,
    a first layer conductor film, among the plurality of conductor films, encompasses the opening in the first layer interlayer insulating film in plan view and is connected to the operation electrode via the opening in the first layer interlayer insulating film,
    the opening in a second layer interlayer insulating film, among the plurality of interlayer insulating films, is encompassed by the first layer conductor film in plan view and is disposed at a position such that a side surface of the opening in the second layer interlayer insulating film is further away than a side surface of the opening in the first layer interlayer insulating film when viewed in a second direction that is perpendicular to the first direction from the opening in the first layer interlayer insulating film,
    a second layer conductor film, among the plurality of conductor films, encompasses the opening in the second layer interlayer insulating film in plan view and is connected to the first layer conductor film through the opening in the second layer interlayer insulating film, and
    a value obtained by averaging, along the first direction, distances in the second direction from the opening in the first layer interlayer insulating film to the side surface of the opening in the second layer interlayer insulating film is greater than or equal to a distance in a height direction from an upper opening plane of the opening in the first layer interlayer insulating film to a lower opening plane of the opening in the second layer interlayer insulating film.

2. The semiconductor device according to claim 1, wherein
    both ends, in the second direction, of the opening of one interlayer insulating film being focused on among the plurality of interlayer insulating films are located outside both ends, in the second direction, of the opening in the interlayer insulating film therebelow.

3. The semiconductor device according to claim 2, wherein
    a value obtained by averaging, along the first direction, distances in the second direction from the opening in one interlayer insulating film being focused on, among the plurality of interlayer insulating films, to a side surface of the opening in the interlayer insulating film one layer thereabove is greater than or equal to a distance in the height direction from an upper opening plane of the opening in the interlayer insulating film being focused on to a lower opening plane of the opening in the interlayer insulating film one layer thereabove.

4. The semiconductor device according to claim 1, further comprising:
    a protective film that is disposed on an uppermost conductor film among the plurality of conductor films and in which an opening is provided; and
    a bump that is disposed inside the opening of the protective film and on the protective film and that is connected to the uppermost conductor film among the plurality of conductor films,
    wherein an area of the uppermost conductor film among the plurality of conductor films is larger than an area of the bump in plan view.

5. The semiconductor device according to claim 2, further comprising:
    a protective film that is disposed on an uppermost conductor film among the plurality of conductor films and in which an opening is provided; and
    a bump that is disposed inside the opening of the protective film and on the protective film and that is connected to the uppermost conductor film among the plurality of conductor films,
    wherein an area of the uppermost conductor film among the plurality of conductor films is larger than an area of the bump in plan view.

6. The semiconductor device according to claim 3, further comprising:
    a protective film that is disposed on an uppermost conductor film among the plurality of conductor films and in which an opening is provided; and
    a bump that is disposed inside the opening of the protective film and on the protective film and that is connected to the uppermost conductor film among the plurality of conductor films,
    wherein an area of the uppermost conductor film among the plurality of conductor films is larger than an area of the bump in plan view.

* * * * *